(12) United States Patent
Cheng

(10) Patent No.: US 10,818,559 B1
(45) Date of Patent: Oct. 27, 2020

(54) FORMATION OF MULTI-SEGMENT CHANNEL TRANSISTOR DEVICES

(71) Applicant: INTERNATIONAL BUSINESS MACHINES CORPORATION, Armonk, NY (US)

(72) Inventor: Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/397,762

(22) Filed: Apr. 29, 2019

(51) Int. Cl.
```
H01L 21/02      (2006.01)
H01L 21/8238    (2006.01)
H01L 27/092     (2006.01)
H01L 29/66      (2006.01)
H01L 29/78      (2006.01)
```
(Continued)

(52) U.S. Cl.
CPC .. *H01L 21/823807* (2013.01); *H01L 21/0214* (2013.01); *H01L 21/02603* (2013.01); *H01L 21/76831* (2013.01); *H01L 21/823821* (2013.01); *H01L 21/823864* (2013.01); *H01L 27/0924* (2013.01); *H01L 29/42392* (2013.01); *H01L 29/6656* (2013.01); *H01L 29/6681* (2013.01); *H01L 29/66545* (2013.01); *H01L 29/785* (2013.01)

(58) Field of Classification Search
CPC ..... H01L 21/823807; H01L 21/823864; H01L 21/0214; H01L 21/02603; H01L 21/76831; H01L 29/6681; H01L 29/42392; H01L 29/66545; H01L 21/823821; H01L 29/785; H01L 29/6656; H01L 27/0924
See application file for complete search history.

(56) References Cited

U.S. PATENT DOCUMENTS

| | | |
|---|---|---|
| 9,129,829 B2 | 9/2015 | Kuhn et al. |
| 9,490,323 B2 | 11/2016 | Rodder et al. |
| 9,583,491 B2 | 2/2017 | Kim et al. |

(Continued)

OTHER PUBLICATIONS

Singh et al., "Analytical Modeling of Parasitic Capacitance in Inserted-Oxide FinFETs", IEEE Transactions on Electron Devices, Dec. 2017, pp. 5274-5278, vol. 64, No. 12.

(Continued)

*Primary Examiner* — Marcos D. Pizarro
*Assistant Examiner* — Sue Tang
(74) *Attorney, Agent, or Firm* — Tutunjian & Bitetto, P.C.; Vazken Alexanian

(57) ABSTRACT

A method of forming a segmented channel transistor device is provided. The method includes forming a stack of alternating sacrificial spacer segments and channel segments on a substrate. The method further includes forming an outer spacer liner on the sacrificial spacer segments and channel segments, and removing a portion of the outer spacer liner, sacrificial spacer segments, and channel segments to form stacked nanowire segments separated by remaining sacrificial portions. The method further includes removing the remaining sacrificial portions, and forming an inner spacer liner on the nanowire segments. The method further includes recessing the outer spacer liner and the inner spacer liner to form nanowire supports between the nanowire segments.

14 Claims, 10 Drawing Sheets

(51) Int. Cl.
  *H01L 21/768* (2006.01)
  *H01L 29/423* (2006.01)

(56) References Cited

U.S. PATENT DOCUMENTS

| | | |
|---|---|---|
| 9,583,591 B2 | 2/2017 | Chuang et al. |
| 9,634,091 B2 | 4/2017 | Ching et al. |
| 9,728,621 B1 * | 8/2017 | Cheng ................ H01L 29/4983 |
| 9,923,055 B1 * | 3/2018 | Cheng ................ H01L 29/0665 |
| 2008/0237683 A1 | 10/2008 | Min et al. |
| 2015/0236120 A1 | 8/2015 | Hashemi et al. |
| 2017/0069481 A1 * | 3/2017 | Doris ................ H01L 29/42392 |
| 2019/0006485 A1 * | 1/2019 | Kim ................ H01L 29/42392 |

OTHER PUBLICATIONS

Zheng et al., "Inserted-oxide FinFET (iFinFET) Design to Extend CMOS Scaling", 2015 International Symposium on VLSI Technology, Systems and Applications, Jun. 2015, pp. 1-2.

Zheng et al., "Simulation-Based Study of the Inserted-Oxide FinFET for Future Low-Power System-on-Chip Applications", IEEE Electron Device Letters, Aug. 2015, pp. 742-744, vol. 36, No. 8.

* cited by examiner

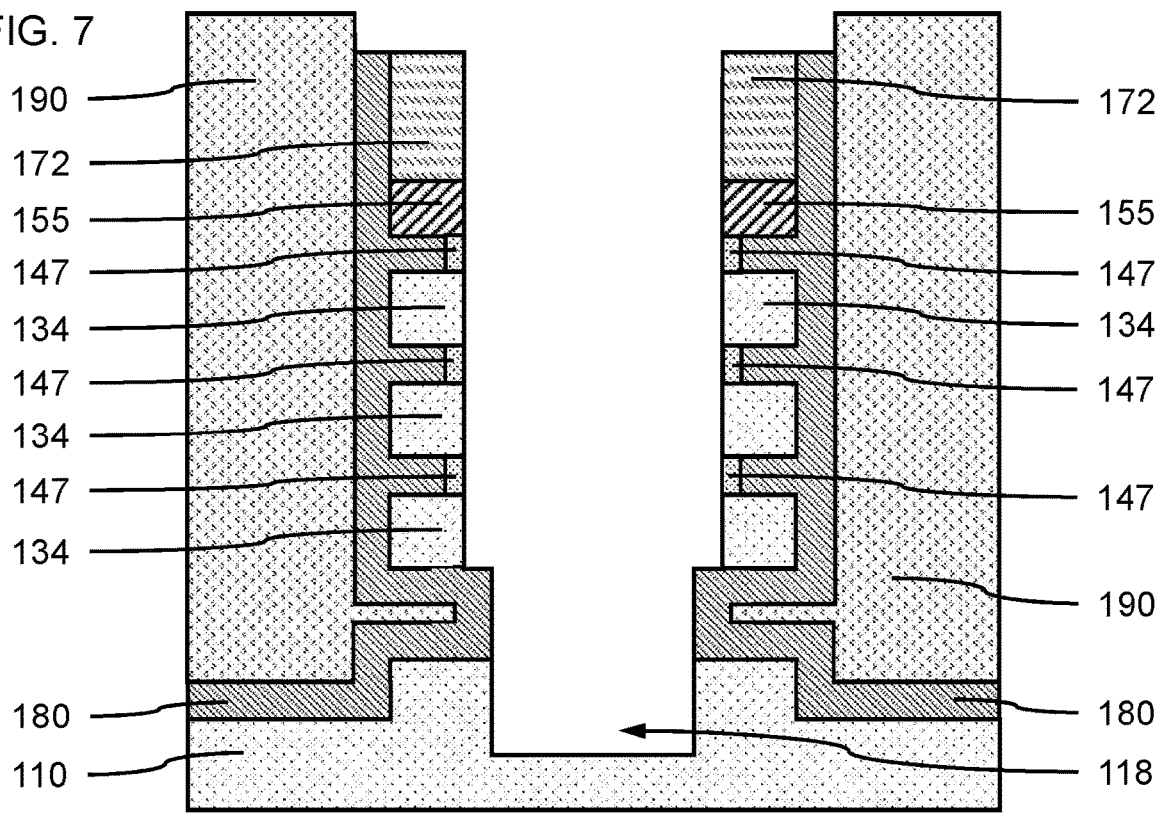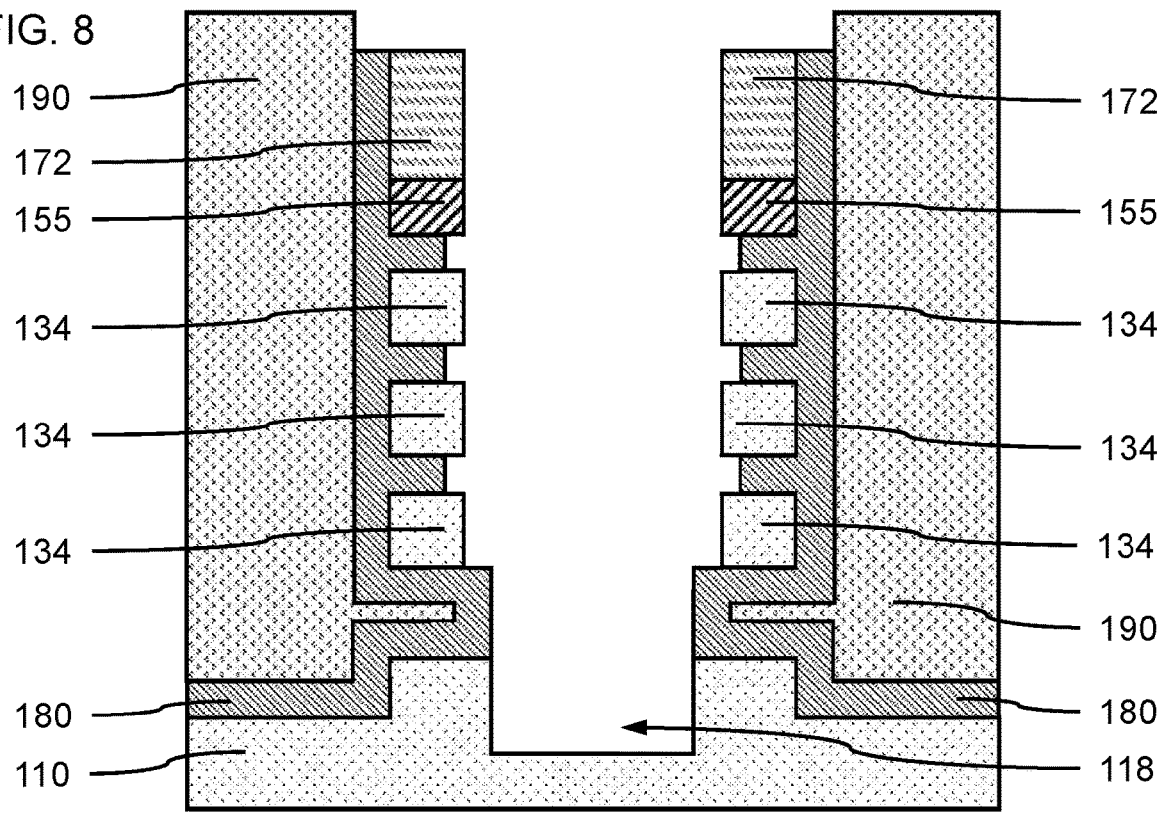

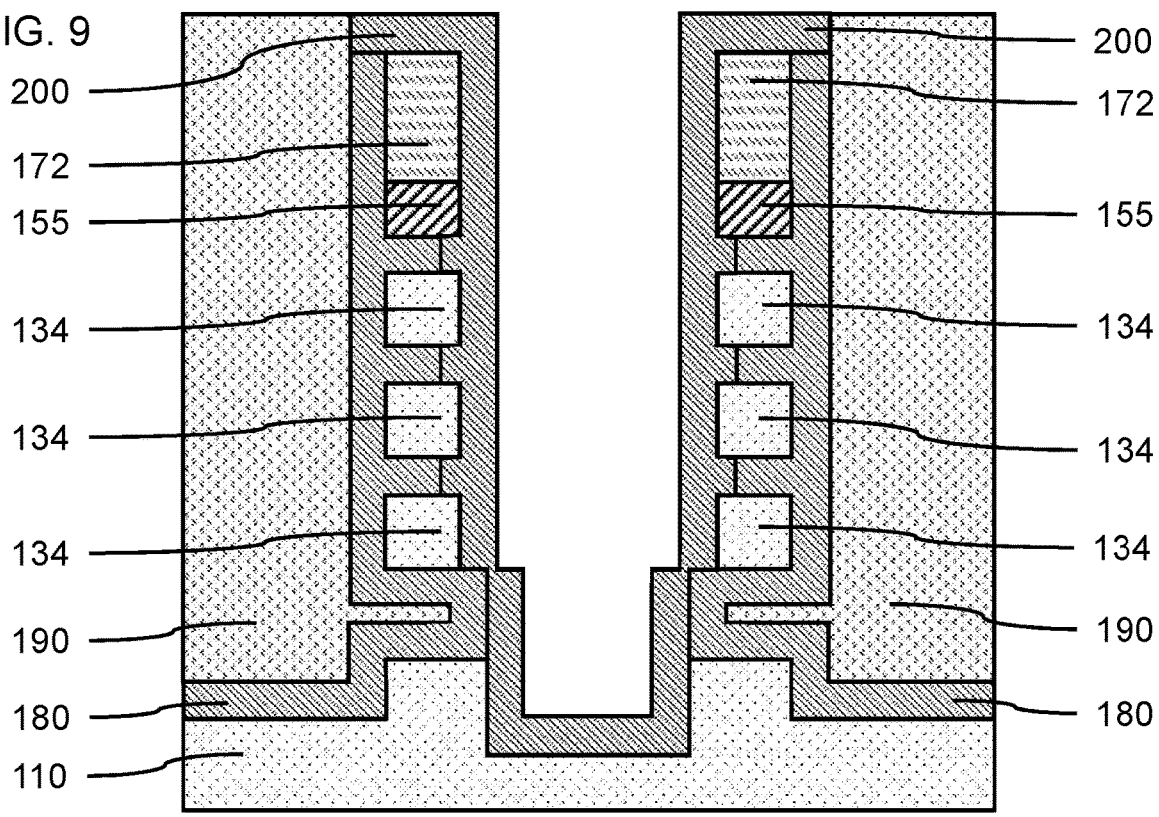
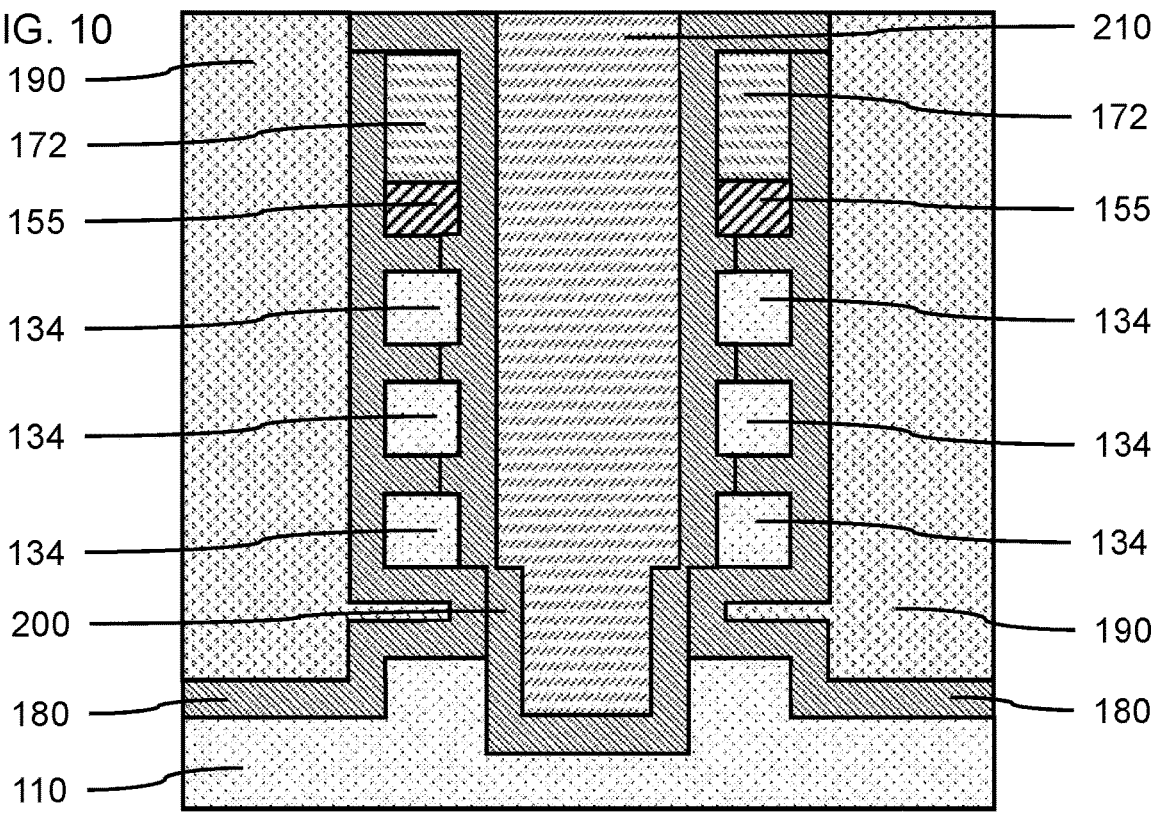

US 10,818,559 B1

FORMATION OF MULTI-SEGMENT CHANNEL TRANSISTOR DEVICES

BACKGROUND

The present invention generally relates to field effect transistor devices, and more particularly to nanowire field effect transistor devices.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a segmented channel transistor device is provided. The method includes forming a stack of alternating sacrificial spacer segments and channel segments on a substrate. The method further includes forming an outer spacer liner on the sacrificial spacer segments and channel segments, and removing a portion of the outer spacer liner, sacrificial spacer segments, and channel segments to form stacked nanowire segments separated by remaining sacrificial portions. The method further includes removing the remaining sacrificial portions, and forming an inner spacer liner on the nanowire segments. The method further includes recessing the outer spacer liner and the inner spacer liner to form nanowire supports between the nanowire segments.

In accordance with another embodiment of the present invention, a method of forming a segmented channel transistor device is provided. The method includes forming a stack of alternating sacrificial spacer segments and channel segments on a substrate, wherein a bottom most sacrificial spacer segment is thicker than the overlying sacrificial spacer segment(s). The method further includes forming an outer spacer liner on the sacrificial spacer segments and channel segments, wherein the outer spacer liner forms a groove in a folded region of the outer spacer liner on the bottom most sacrificial spacer segment. The method further includes forming a fill layer on the outer spacer liner, and removing a central portion of the outer spacer liner, sacrificial spacer segments, and channel segments to form stacked nanowire segments separated by remaining sacrificial portions. The method further includes removing the remaining sacrificial portions. The method further includes forming an inner spacer liner on the nanowire segments, and forming a plug layer on the inner spacer liner.

In accordance with yet another embodiment of the present invention, a segmented channel transistor device is provided. The device includes an isolation liner on a substrate, and a fill layer plate in a groove formed by a folded region of the isolation liner. The device further includes a stack of nanowire segments on the isolation liner, and a gate dielectric layer on the nanowire segments.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 7 is a cross-sectional side view showing an exposed portion of the template segment and underlying sacrificial spacer segments and channel segments removed to form stacked nanowire segments, in accordance with an embodiment of the present invention;

FIG. 8 is a cross-sectional side view showing the remaining sacrificial portion of the sacrificial spacer segments removed, in accordance with an embodiment of the present invention;

FIG. 9 is a cross-sectional side view showing an inner spacer liner formed in the recesses and on the sidewalls of the nanowire segments and on the lateral spacers, in accordance with an embodiment of the present invention;

FIG. 10 is a cross-sectional side view showing a plug layer formed in the trench between the inner spacer liners on adjacent stacks of nanowire segments, in accordance with an embodiment of the present invention;

DETAILED DESCRIPTION

Embodiments of the present invention provide stacked nanowires with or without intervening nanowire supports, where the stacked nanowires can provide superior gate characteristics over fin field effect transistors devices due to the gate-all-around type structures. Multiple nanowire segments can be used to increase the effect device width and charge carrying capacity. The structure can have a bottom isolation structure combining both a dielectric fill and inner and outer spacer liners.

Embodiments of the present invention also provide methods of fabricating stacked nanowires with or without intervening nanowire supports, where the formation of the stacked nanowire segments does not involve wafer bonding steps or additional mechanical anchors. A fin type fabrication process utilizing sidewall image transfer processes can be used to form multiple fin-like stacks of adjacent nanowire segments.

Embodiments of the present invention provide a method of using spacer liners and fill layers to avoid pattern collapse of the stacked nanowire segments during the fabrication process.

Exemplary applications/uses to which the present invention can be applied include, but are not limited to: digital logic devices (e.g., NAND gates, NOR gates, XOR gates, etc.) memory devices (e.g., random access memory (RAM), dynamic RAM (DRAM), static RAM (SRAM), etc.).

It is to be understood that aspects of the present invention will be described in terms of a given illustrative architecture; however, other architectures, structures, substrate materials and process features and steps can be varied within the scope of aspects of the present invention.

Figure 1:
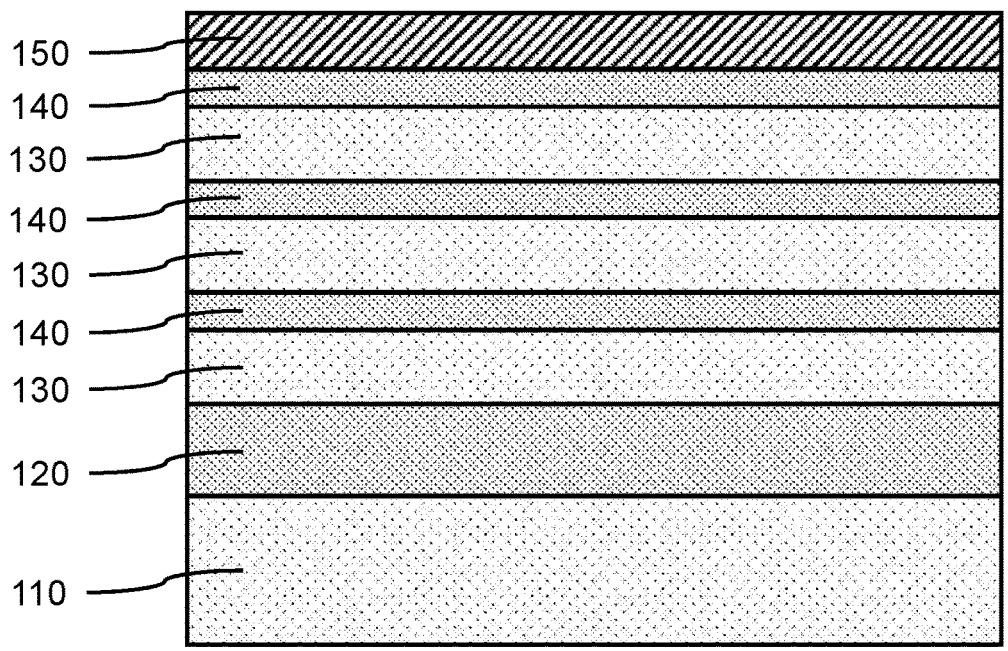
FIG. 1 is a cross-sectional side view showing a stack of alternating of alternating sacrificial spacer layers and channel layers with a template layer on the stack, where a bottom most sacrificial layer is thicker than the overlying sacrificial layer(s), in accordance with an embodiment of the present invention.

Referring now to the drawings in which like numerals represent the same or similar elements and initially to FIG. 1, a cross-sectional side view of a stack of alternating of alternating sacrificial spacer layers and channel layers with a template layer on the stack, where a bottom most sacrificial layer is thicker than the overlying sacrificial layer(s) is shown, in accordance with an embodiment of the present invention.

In one or more or more embodiments, a stack of alternating sacrificial spacer layers 120, 140 and channel layers 130 can be formed on a substrate 110, where the substrate 110 can include a semiconductor substrate. In various embodiments, the sacrificial spacer layers 120, 140 and channel layers 130 can be formed by epitaxial growth or heteroepitaxial growth on the substrate 110 or an underlying layer, where the underlying layer can be single crystal.

In one or more embodiments, the substrate 110 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)), where the substrate can provide a single crystal surface for growth of a sacrificial spacer layer 120.

In one or more embodiments, the sacrificial spacer layers 120, 140 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)), where the material of the sacrificial spacer layers 120 is different from the material of the channel layers 130 to allow selective removal, while providing for epitaxial or heteroepitaxial growth on the alternating layers.

In one or more embodiments, the bottom most sacrificial spacer layers 120 grown directly on the substrate surface can be thicker than subsequently formed sacrificial spacer layers 140. In various embodiments, the bottom most sacrificial spacer layer 120 can have a thickness in a range of about 10 nanometers (nm) to about 50 nm, or about 20 nm to about 40 nm, to provide for the formation of dielectric isolation between the stacked nanowire transistor and the substrate. In various embodiments, the overlying sacrificial spacer layers 140 can have a thickness in a range of about 6 nm to about 20 nm, or about 10 nm to about 15 nm, to provide sufficient distance between the channel layers 130 to form a gate-all-around (GAA) structure.

In one or more embodiments, the channel layers 130 can be a type IV semiconductor material (e.g., silicon (Si), germanium (Ge)), a type IV-IV semiconductor material (e.g., silicon carbide (SiC), silicon germanium (SiGe), or a III-V semiconductor material (e.g., gallium arsenide (GaAs), indium phosphide (InP)). The channel layers 130 can be single crystal to provide for epitaxial or heteroepitaxial growth.

In one or more embodiments, the channel layers 130 can have a thickness in a range of about 4 nanometers (nm) to about 12 nm, or about 6 nm to about 9 nm, although other thicknesses are also contemplated.

In one or more embodiments, a template layer 150 can be formed on the stack of alternating sacrificial spacer layers 120, 140 and channel layers 130, where the template layer 150 can be formed by a blanket deposition (e.g., chemical vapor deposition (CVD), plasma enhanced CVD (PECVD)). In various embodiments, the template layer 150 can be a dielectric material, including, but not limited to, silicon oxide (SiO), silicon nitride (SiN), silicon oxynitride (SiON), silicon carbonitride (SiCN), silicon oxy carbonitride (SiOCN), silicon boro carbonitride (SiBCN), and combinations thereof.

Figure 2:
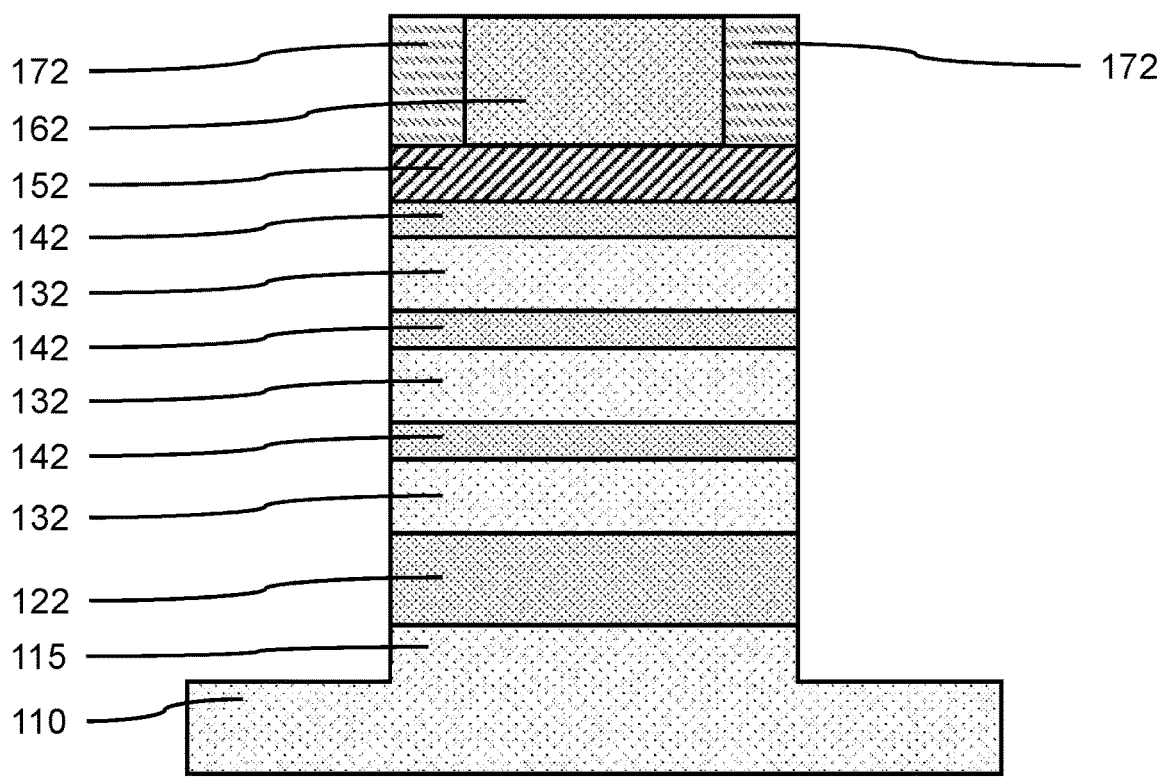
FIG. 2 is a cross-sectional side view showing a mandrel and lateral spacers on a patterned stack of alternating sacrificial spacer segments and channel segments, in accordance with an embodiment of the present invention.

FIG. 2 is a cross-sectional side view showing a mandrel and lateral spacers on a patterned stack of alternating sacrificial spacer segments and channel segments, in accordance with an embodiment of the present invention.

In one or more embodiments, a mandrel 162 can be formed on the stack of alternating sacrificial spacer layers 120, 140 and channel layers 130, where the mandrel 162 can be formed by depositing and patterning a mandrel layer. In various embodiments, the mandrel layer and mandrel 162 can be amorphous silicon (a-Si), amorphous carbon (a-C), germanium (Ge), silicon-germanium (SiGe), or other easily etchable materials that can be selectively removed from the sacrificial spacer layer(s) 120, 140 and channel layer(s) 130. The mandrel 162 can be a different material from the template layer 150. The lateral width of the mandrel 162 can determine the spacing between subsequently formed adjacent devices. The lateral width of the mandrel can be in a range of about 15 nm to about 60 nm, or about 25 nm to about 40 nm, although other widths are contemplated.

In one or more embodiments, lateral spacers 172 can be formed on the mandrel 162, where the lateral spacers 172 can be formed by a conformal deposition, for example, atomic layer deposition (ALD), plasma enhanced ALD (PEALD), or a combination thereof, to a predetermined thickness. The thickness of the lateral spacers 172 can determine the width of subsequently formed nanowires. In various embodiments, the lateral spacers 172 can have a width in a range of about 5 nm to about 20 nm, or about 6 nm to about 10 nm, to determine the width of subsequently formed nanowires.

In various embodiments, the lateral spacers 172 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof. The lateral spacers 172 can be a different dielectric material from the template layer 150.

In one or more embodiments, the mandrel 162 and lateral spacers 172 can be used as a mask to form a template segment 152 on a patterned stack of alternating sacrificial spacer segments 122, 142 and channel segments 132. A directional etch, for example, a reactive ion etch (RIE) can be used to remove portions of the template layer 150 to form a template segment 152, and remove portions of the underlying sacrificial layers 120, 140 and channel layer(s) 130 to form sacrificial spacer segments 122, 142 and channel segments 132.

In one or more embodiments, the template segment 152, sacrificial spacer segments 122, 142, and channel segments 132, can have a length in a range of about 25 nm to about 100 nm, or about 40 nm to about 60 nm, although other lengths are also contemplated. The length of the channel segments 132 can determine the lengths of subsequently formed nanowires.

In various embodiments, over-etching can extend below the surface of the substrate 110 to form a mesa region 115 under the bottom most sacrificial spacer segment 122 to ensure the sacrificial spacer segments 122, 142, and channel segments 132 are formed.

Figure 3:
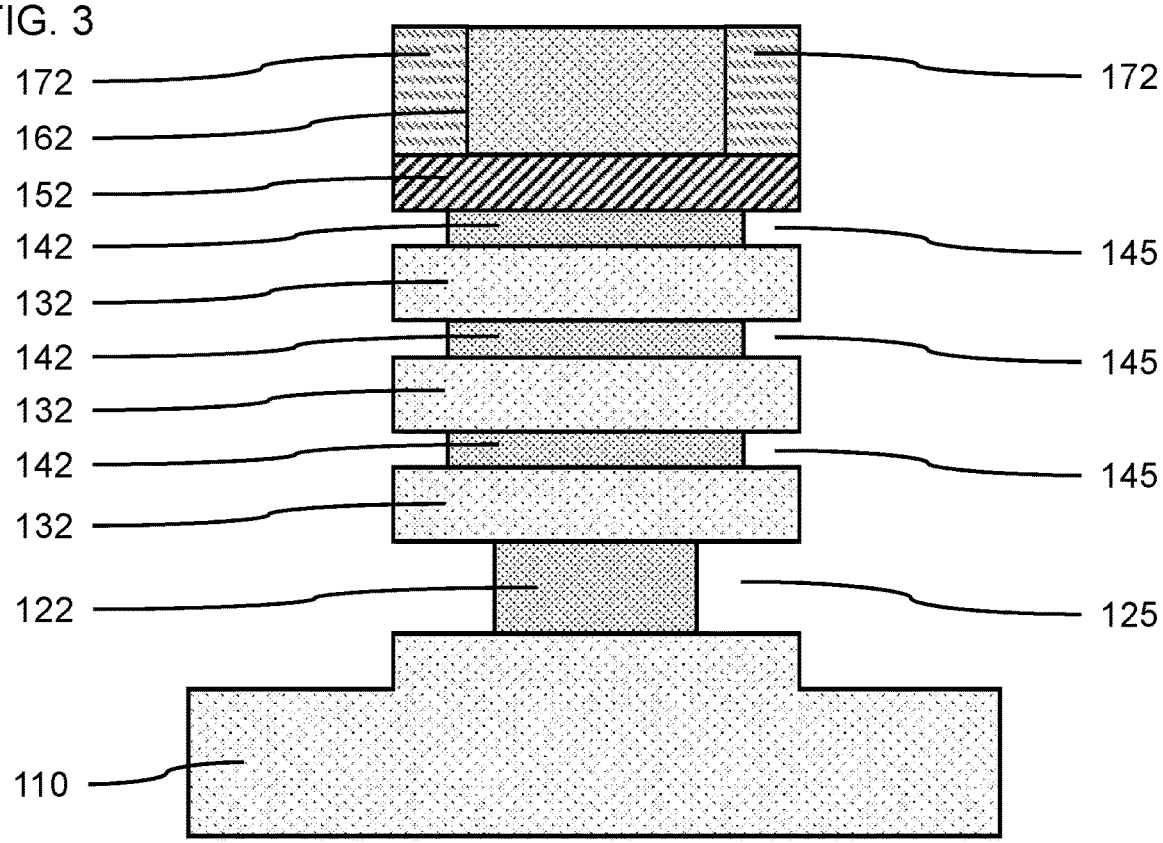
FIG. 3 is a cross-sectional side view showing opposite sides of the sacrificial spacer segments, in accordance with an embodiment of the present invention.

FIG. 3 is a cross-sectional side view showing opposite sides of the sacrificial spacer segments, in accordance with an embodiment of the present invention.

In one or more embodiments, opposite sides of the sacrificial spacer segments 122, 142 can be recessed using an isotropic etch, for example, a wet chemical etch or dry plasma etch. The recesses 145 formed in the sacrificial spacer segments 142 can have a depth less than the width of the lateral spacers 172.

In various embodiments, the recesses 125 formed in the sacrificial spacer segments 122 can have a depth greater than the width of the lateral spacers 172. The recess of the bottom most sacrificial spacer segment 122 can be deeper than the depth of the recesses in the upper sacrificial spacer segments 142 due to the etchant having greater access to the sidewalls of the thicker bottom most sacrificial spacer segment 122.

Figure 4:
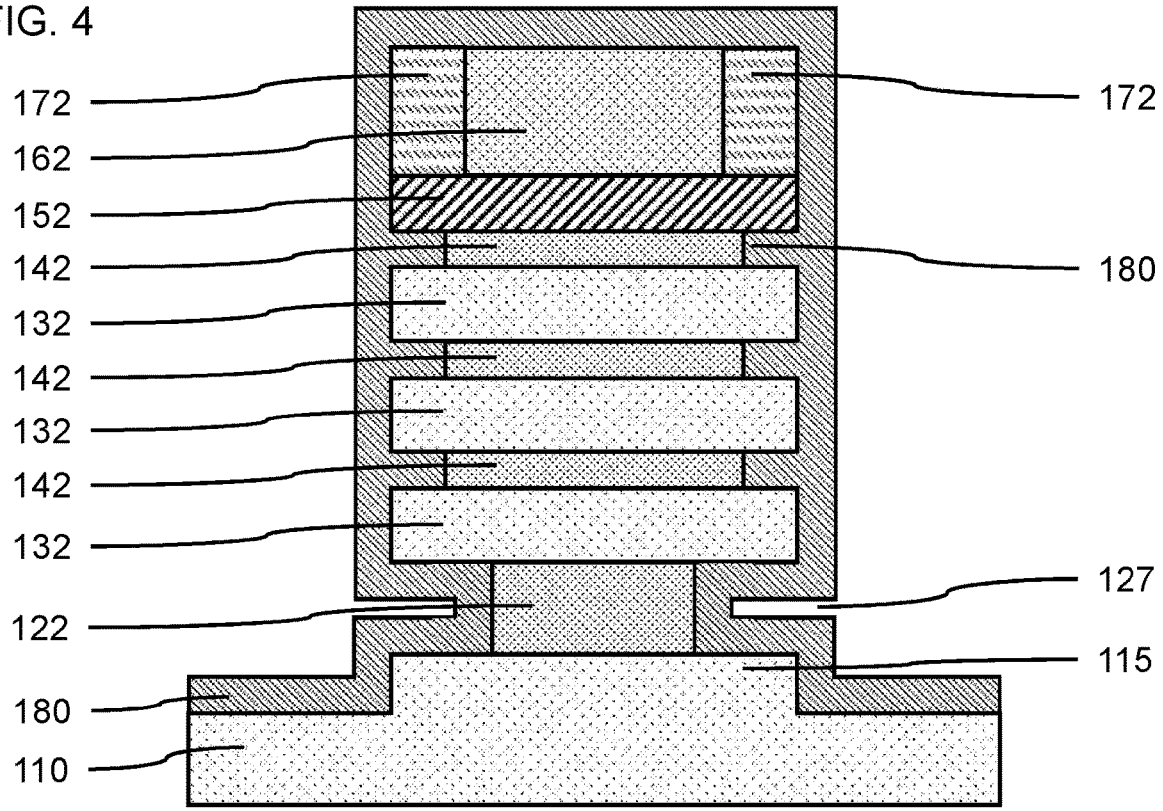
FIG. 4 is a cross-sectional side view showing an outer spacer liner formed in the recesses on opposite sides of the sacrificial spacer segments, in accordance with an embodiment of the present invention.

FIG. 4 is a cross-sectional side view showing an outer spacer liner formed in the recesses on opposite sides of the sacrificial spacer segments, in accordance with an embodiment of the present invention.

In one or more embodiments, an outer spacer liner 180 can be formed on the exposed surfaces of the lateral spacers 172, mandrel 162, channel segments 132, sacrificial spacer segments 122, 142, and substrate 110 including a mesa region 115, where the outer spacer liner 180 can be formed by a conformal deposition (e.g., ALD, PEALD). The outer spacer liner 180 can fill in the recesses 145 on opposite sides of the sacrificial spacer segments 122, 142.

In various embodiments, the outer spacer liner 180 can be an dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof. In various embodiments, the outer spacer liner 180 can be silicon oxynitride (SiON) to provide etch selectivity relative to a subsequently formed lateral fill material.

In various embodiments, the outer spacer liner 180 can have a thickness in a range of about 3 nm to about 10 nm, or about 4 nm to about 10 nm, or about 3 nm to about 6 nm, although other thickness are contemplated. The thickness of the outer spacer liner 180 can be sufficient to support subsequently formed nanowires to avoid pattern collapse of the stacked nanowires. In various embodiments, the outer spacer liner 180 can completely fill the recesses 145 on opposite sides of the sacrificial spacer segments 142, and partially fill the recess 125 at the most bottom sacrificial spacer segments 122, where a groove 127 can be formed between portions of the outer spacer liner 180.

Figure 5:
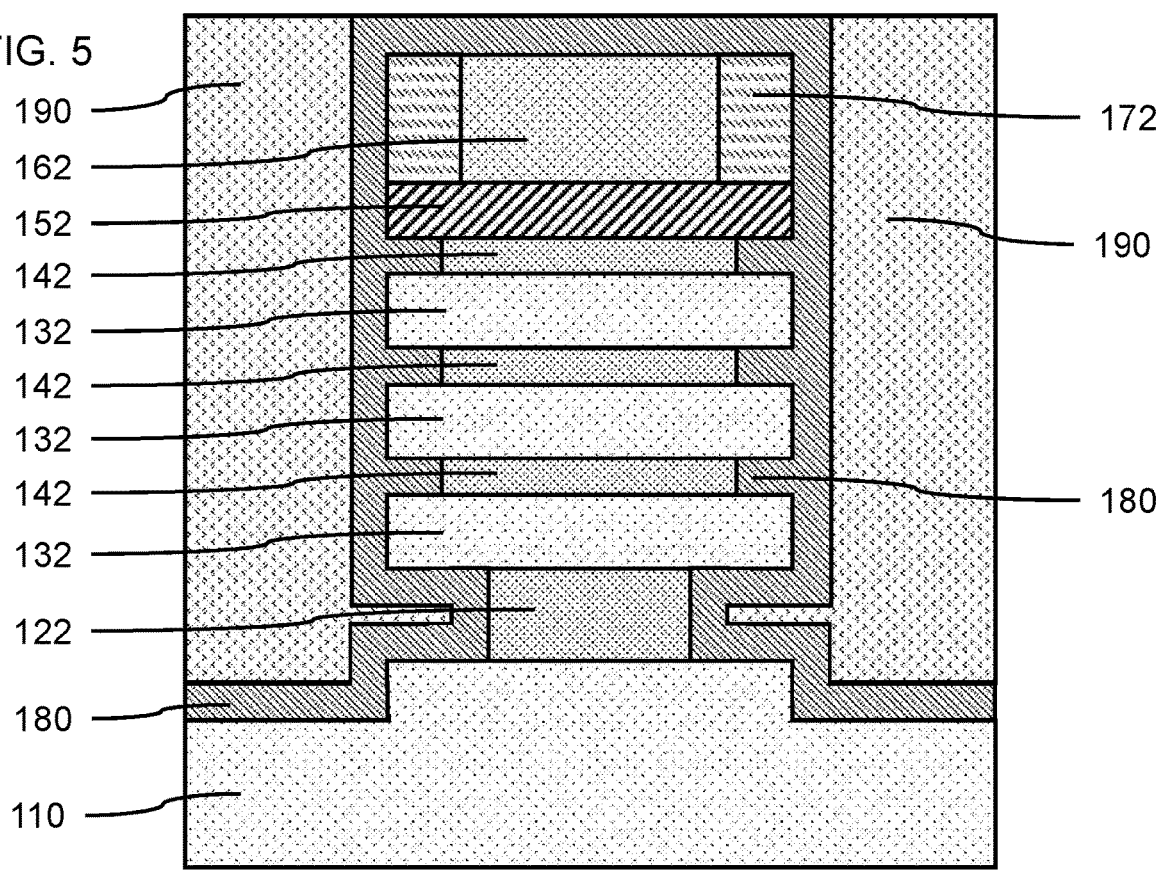
FIG. 5 is a cross-sectional side view showing a fill layer formed on the outer spacer liner and substrate, in accordance with an embodiment of the present invention.

FIG. 5 is a cross-sectional side view showing a fill layer formed on the outer spacer liner and substrate, in accordance with an embodiment of the present invention.

In one or more embodiments, a fill layer 190 can be formed on the outer spacer liner 180 and substrate 110, where the fill layer 190 can be formed by, for example, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, low temperature oxide deposition (LTO), ozone/TEOS deposition, limited reaction processing CVD (LRPCVD), spin-on-coating, ion beam deposition, electron beam deposition, laser assisted deposition, chemical solution deposition, or a combination of these methods.

In various embodiments, the fill layer 190 can be a flowable oxide (FOX) that can fill in the recesses and undercuts formed by the outer spacer liner 180 and sacrificial spacer segment 122.

In various embodiments, the height of the fill layer 190 can be reduced and the surface planarized using chemical-mechanical polishing (CMP) to provide a smooth, flat surface and expose a top portion of the outer spacer liner 180. For example, as shown in FIG. 3, the thicker sacrificial spacer segment 122 has more lateral etch, so that in FIG. 4, when dielectric 180 is deposited, the dielectric 180 completely pinches off the smaller spacer spacing but not the bottom layer. Then in FIG. 5 the dielectric 190 fills the rest of the gap in the bottom layer, resulting in a sandwiched bottom isolation layer.

Figure 6:
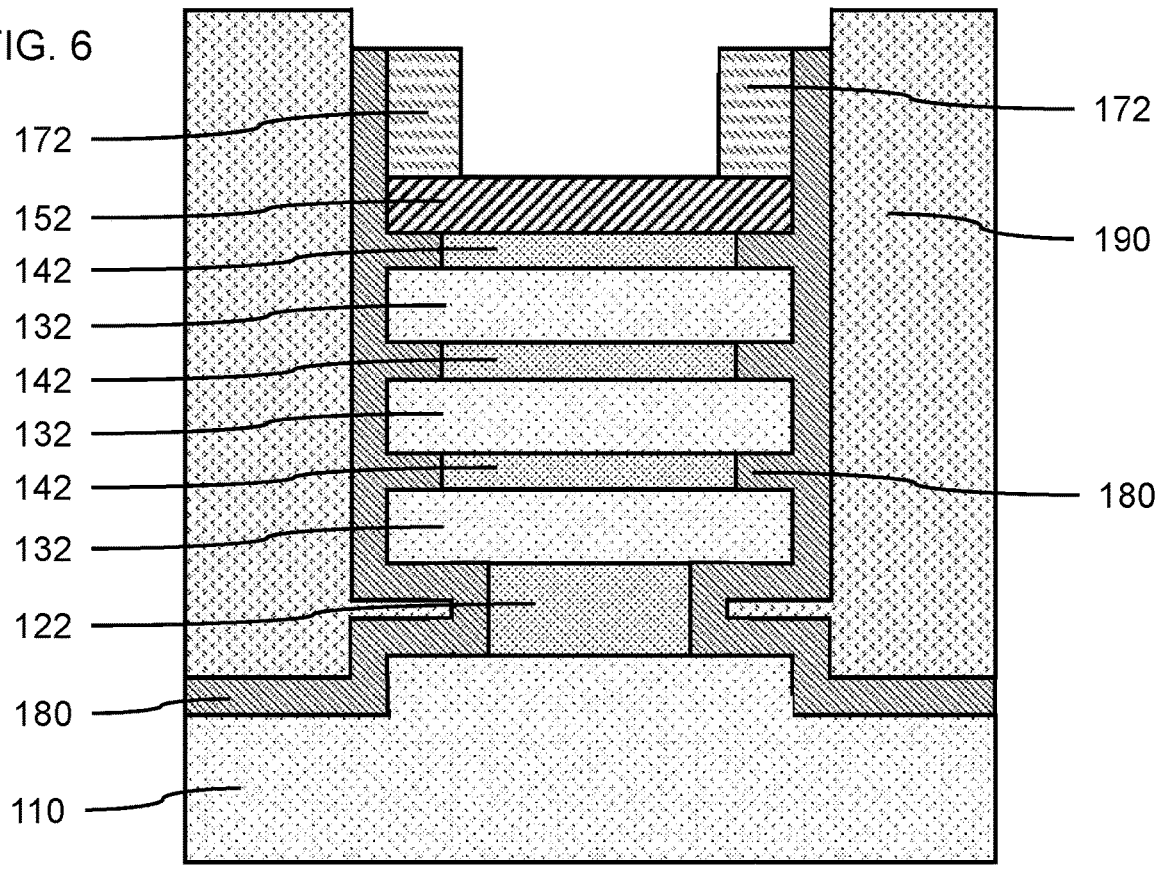
FIG. 6 is a cross-sectional side view showing a portion of the outer spacer liner removed from the mandrel and lateral spacers, and the mandrel removed from between the lateral spacers, in accordance with an embodiment of the present invention.

FIG. 6 is a cross-sectional side view showing a portion of the outer spacer liner removed from the mandrel and lateral spacers, and the mandrel removed from between the lateral spacers, in accordance with an embodiment of the present invention.

In one or more embodiments, the exposed portion of the outer spacer liner 180 can be removed using a selective isotropic etch (e.g., wet chemical etch) or a selective directional etch (e.g., RIE) to expose the underlying mandrel 162. The exposed mandrel can then be removed using a selective etch to expose the portion of the template segment 152 between the lateral spacers 172.

FIG. 7 is a cross-sectional side view showing an exposed portion of the template segment and underlying sacrificial spacer segments and channel segments removed to form stacked nanowire segments, in accordance with an embodiment of the present invention.

In one or more embodiments, the exposed portion of the template segment 152 can be removed using a selective directional etch (e.g., RIE) to form template bars 155 under the lateral spacers 172, where the form template bars 155 can have the same width as the lateral spacers 172. Removal of the portion of the template segment 152 can expose a portion of the sacrificial spacer segment 142. Portions of the underlying stack of alternating sacrificial spacer segments 122, 142, and channel segments 132 can be removed using a selective directional etch (e.g., RIE) to form stacked nanowire segments 134 separated by the remaining sacrificial portions 147 of the sacrificial spacer segments 142 and portions of the outer spacer liner 180. The stack of alternating sacrificial spacer segments 122, 142, and channel segments 132 can form adjacent stacked nanowire segments 134 by removing the center portions of the channel segments 132.

In various embodiments, the selective etching of the bottom most sacrificial spacer segment 122 and the overlying channel segment 132 can leave a jog formed by a portion of the outer spacer liner 180 folded around a portion of fill layer 190. The thicknesses of the bottom most sacrificial spacer segment 122 and the outer spacer liner 180 can determine the thickness of the fill layer 190 in the fold. In various embodiments, the recess in the bottom most sacrificial spacer segment 122 may be completely filled by the outer spacer liner 180, so no fold is formed.

In various embodiments, a portion of the mesa region 115 and substrate 110 can be removed using a selective directional etch to form an isolation region trench 118.

FIG. 8 is a cross-sectional side view showing the remaining sacrificial portion of the sacrificial spacer segments removed, in accordance with an embodiment of the present invention.

In one or more embodiments, the remaining sacrificial portions 147 of the sacrificial spacer segments 142 can be removed using a selective, isotropic etch (e.g., wet chemical etch) to form recesses between the nanowire segments 134 opposite the outer spacer liner 180.

FIG. 9 is a cross-sectional side view showing an inner spacer liner formed in the recesses and on the sidewalls of the nanowire segments and on the lateral spacers, in accordance with an embodiment of the present invention.

In one or more embodiments, an inner spacer liner 200 can be formed in the recesses and on the sidewalls of the nanowire segments 134 and on the lateral spacers 172 and exposed portions of the outer spacer liner 180. The inner spacer liner 200 can be formed by a conformal deposition (e.g., ALD, PEALD), where the inner spacer liner 200 can fill in the recesses between the nanowire segments 134 and a nanowire segment 134 and template bar 155.

In various embodiments, the inner spacer liner 200 can be an dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof. In various embodiments, the inner spacer liner 200 can be silicon oxynitride (SiON). The inner spacer liner 200 can be the same material as the outer spacer liner 180, so the material between nanowire segments 134 is the same.

FIG. 10 is a cross-sectional side view showing a plug layer formed in the trench between the inner spacer liners on adjacent stacks of nanowire segments, in accordance with an embodiment of the present invention.

In one or more embodiments, a plug layer 210 can be formed in the trench between the inner spacer liners 200 on adjacent stacks of nanowire segments 134, where the plug layer 210 can be formed by a conformal deposition, to avoid pinch-off, or by a blanket deposition.

In various embodiments, the plug layer 210 can be a flowable oxide (FOX) that can fill in the trench between the inner spacer liner 200.

Figure 11:
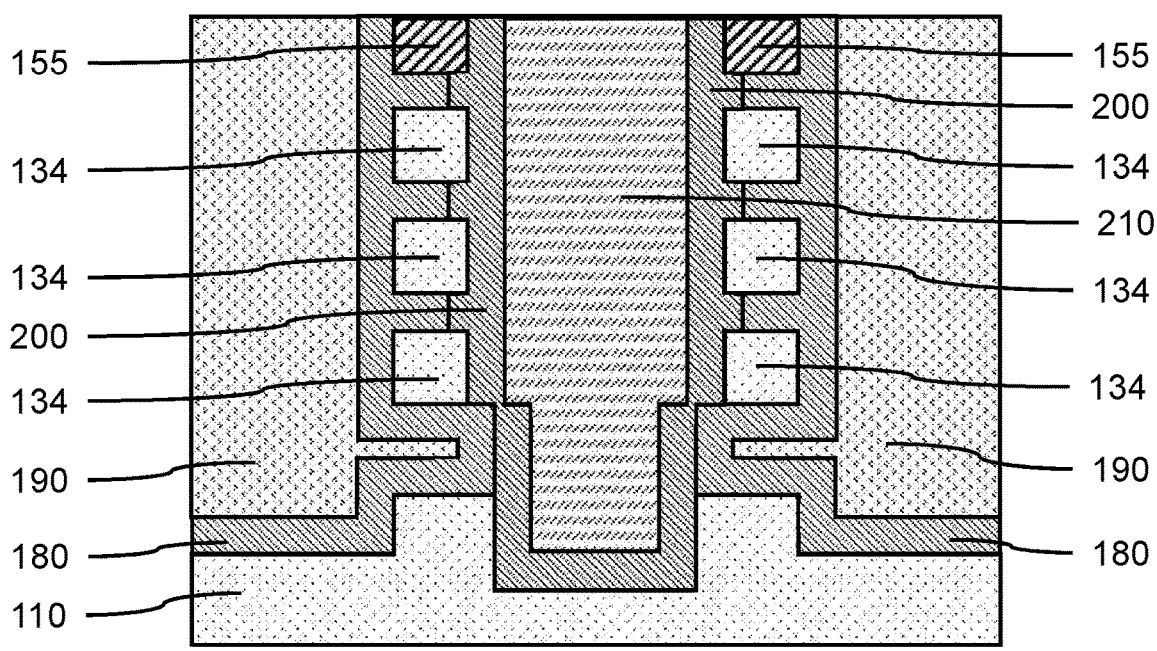
FIG. 11 is a cross-sectional side view showing the lateral spacers removed and portions of the plug layer, fill layer, inner spacer liner, and outer spacer liner removed to expose the template bars, in accordance with an embodiment of the present invention.

FIG. 11 is a cross-sectional side view showing the lateral spacers removed and portions of the plug layer, fill layer, inner spacer liner, and outer spacer liner removed to expose the template bars, in accordance with an embodiment of the present invention.

In one or more embodiments, a portion of the outer spacer liner 180, inner spacer liner 200, lateral spacers 172, and plug layer 210 can be removed using CMP and/or selective etch(es) to expose the template bars 155.

Figure 12:
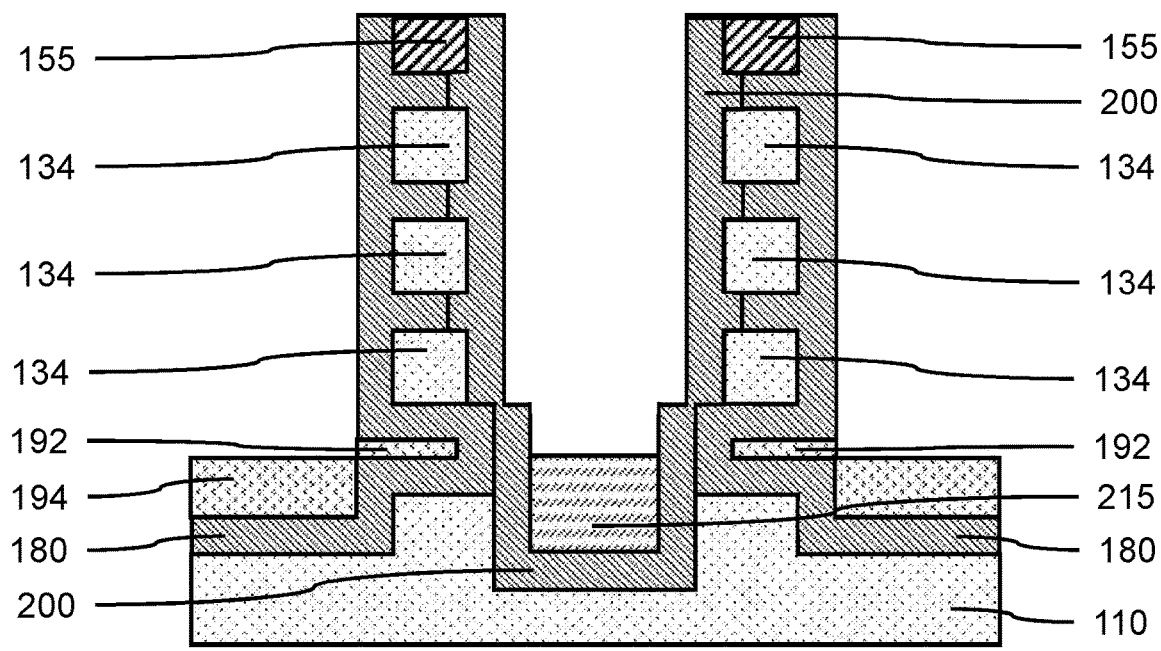
FIG. 12 is a cross-sectional side view showing the plug layer recessed in the trench between the inner spacer liners to expose the inner spacer liner and form a bottom isolation region, in accordance with an embodiment of the present invention.

FIG. 12 is a cross-sectional side view showing the plug layer recessed in the trench between the inner spacer liners to expose the inner spacer liner and form a bottom isolation region, in accordance with an embodiment of the present invention.

In one or more embodiments, the fill layer 190 and the plug layer 210 can be recessed at the same time and to the same depth using a selective etch to expose the outer spacer liners 180 and inner spacer liner 200, where the fill layer 190 and the plug layer 210 are the same material. Recessing of the fill layer 190 can form a fill layer plate 192 in the groove 127 in the folded region of the outer spacer liner 180. Another portion of the fill layer 190 can form a fill layer block 194, where the fill block may be separated from the fill layer plate 192 depending on the depth to which the fill layer 190 is recessed.

In various embodiments, the plug layer 210 can be recessed in the trench between portions of the inner spacer liners 200 to form a bottom isolation region 215 in the isolation region trench 118.

Figure 13:
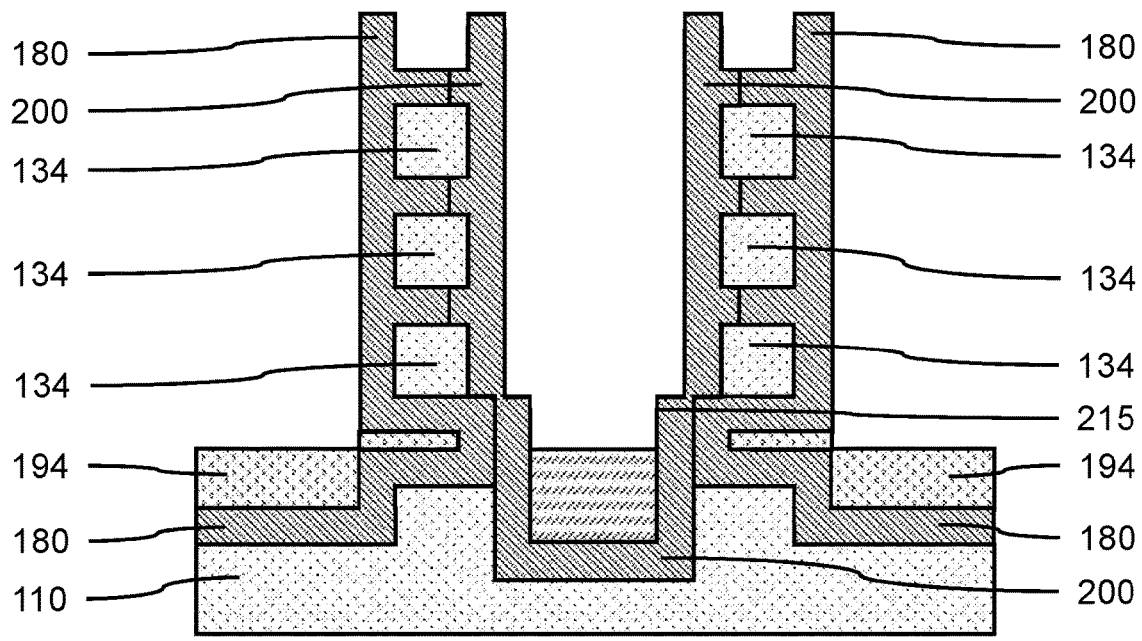
FIG. 13 is a cross-sectional side view showing the fill layer recessed to expose the outer spacer liner, in accordance with an embodiment of the present invention.

FIG. 13 is a cross-sectional side view showing the fill layer recessed to expose the outer spacer liner, in accordance with an embodiment of the present invention.

In one or more embodiments, the template bars 155 can be removed using a selective etch.

Figure 14:
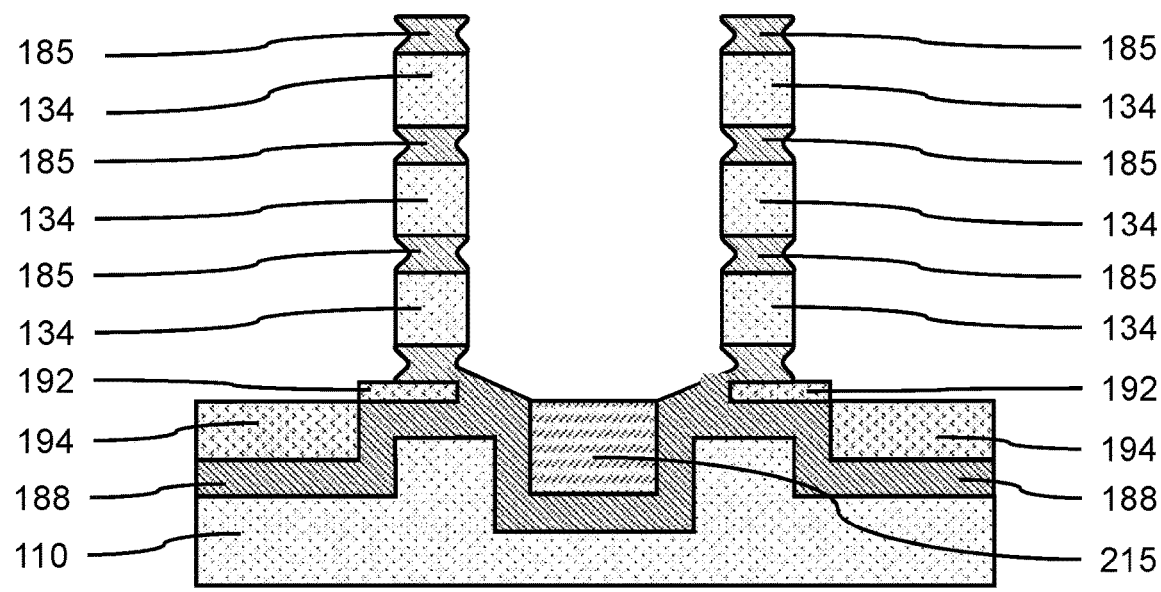
FIG. 14 is a cross-sectional side view showing exposed portions of the inner spacer liner and the outer spacer liner removed to form nanowire supports between the nanowire segments, in accordance with an embodiment of the present invention.

FIG. 14 is a cross-sectional side view showing exposed portions of the inner spacer liner and the outer spacer liner removed to form nanowire supports between the nanowire segments, in accordance with an embodiment of the present invention.

In one or more embodiments, exposed portions of the inner spacer liner 200 and the outer spacer liner 180 can be removed to form nanowire supports 185 between the nanowire segments 134. The exposed portions of the inner spacer liner 200 and the outer spacer liner 180 can be removed using a selective isotropic etch (e.g., wet chemical etch, dry plasma etch), where the etch can form indentations in the nanowire supports 185, such that the area between the nanowire segments 134 separated by the nanowire supports 185 has a narrower section that can be subsequently filled with a gate dielectric layer and conductive gate fill to form a pinched gate area. The pinched gate area can provide electrostatic behavior comparable to a full gate-all-around structure. Each of the nanowire supports 185 can have an indentation that forms a narrower section between each adjacent pair of the nanowire segments 134.

In various embodiments, the removal of the fill layer 190 and the plug layer 210, and the formation of the nanowire supports 185 can form a free-standing fin-like stack of nanowire segments 134. Removal of portions of the fill layer 190 can form a fill layer plate 192 in the groove 127 formed by the folded region between portions of the outer spacer liner 180 and adjoining the inner spacer liner 200.

In various embodiments, removal of portions of the adjoining the inner spacer liner 200 and the outer spacer liner 180 adjacent to the isolation region 215 and fill layer plate 192 can form an isolation liner 188 disposed between the substrate 110 and portions of the fill layer block 194, the fill layer plate 192, the bottom most nanowire segments 134, and the isolation region 215. A fill layer plate 192 can be in the groove 127 formed by a folded region of the isolation liner 188, where the fill layer plate 192 can be underneath at least a portion of the stack of nanowire segments 134.

Figure 15:
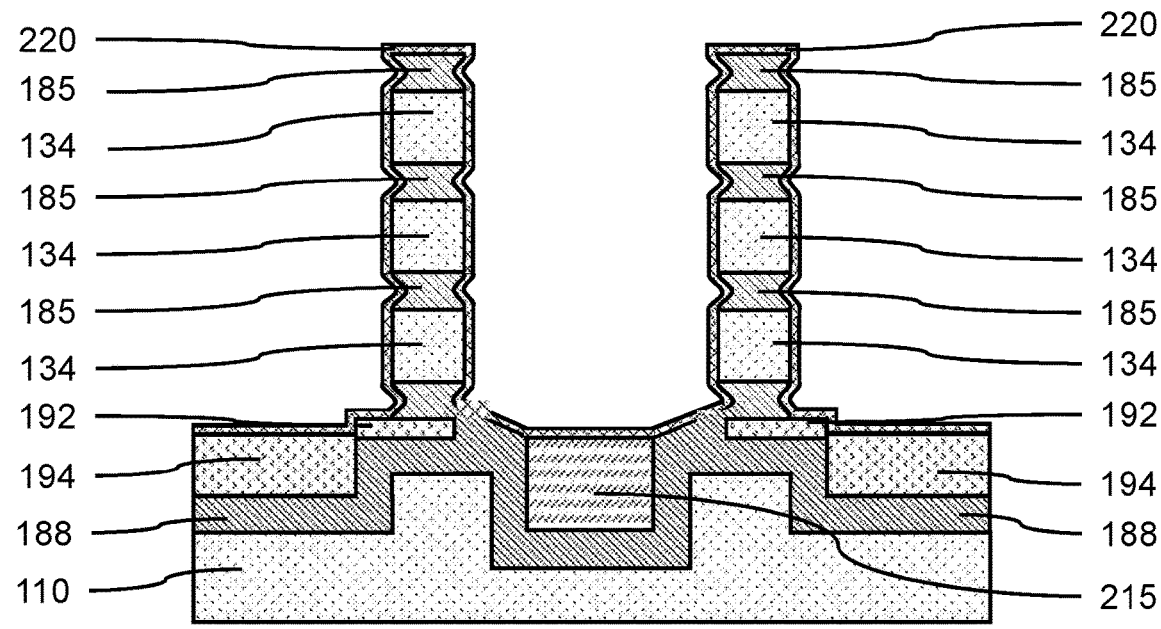
FIG. 15 is a cross-sectional side view showing a gate dielectric layer formed on the recessed fill layer, isolation region, isolation liner, nanowire supports, and nanowire segments, in accordance with an embodiment of the present invention.

FIG. 15 is a cross-sectional side view showing a gate dielectric layer formed on the recessed fill layer, isolation region, isolation liner, nanowire supports, and nanowire segments, in accordance with an embodiment of the present invention.

In various embodiments, the device fabrication can be completed using a gate-first or a gate last (i.e., replacement metal gate (RMG)) process. For a gate-last process, a dummy gate structure can be formed, where the dummy gate structure includes an easily removable material instead of a conductive gate electrode.

In one or more embodiments, a gate dielectric layer 220 can be formed on the recessed fill layer 190, isolation region 215, isolation liner 188, nanowire supports 185, and nanowire segments 134, where the gate dielectric layer can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc.

In various embodiments, the gate dielectric layer 220 can be a dielectric material, including, but not limited to, silicon oxide (SiO), silicon nitride (SiN), silicon oxynitride (SiON), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 220 can have a thickness in a range of about 1 nm to about 5 nm, or about 2 nm to about 4 nm, although other thicknesses are also contemplated.

Figure 16:
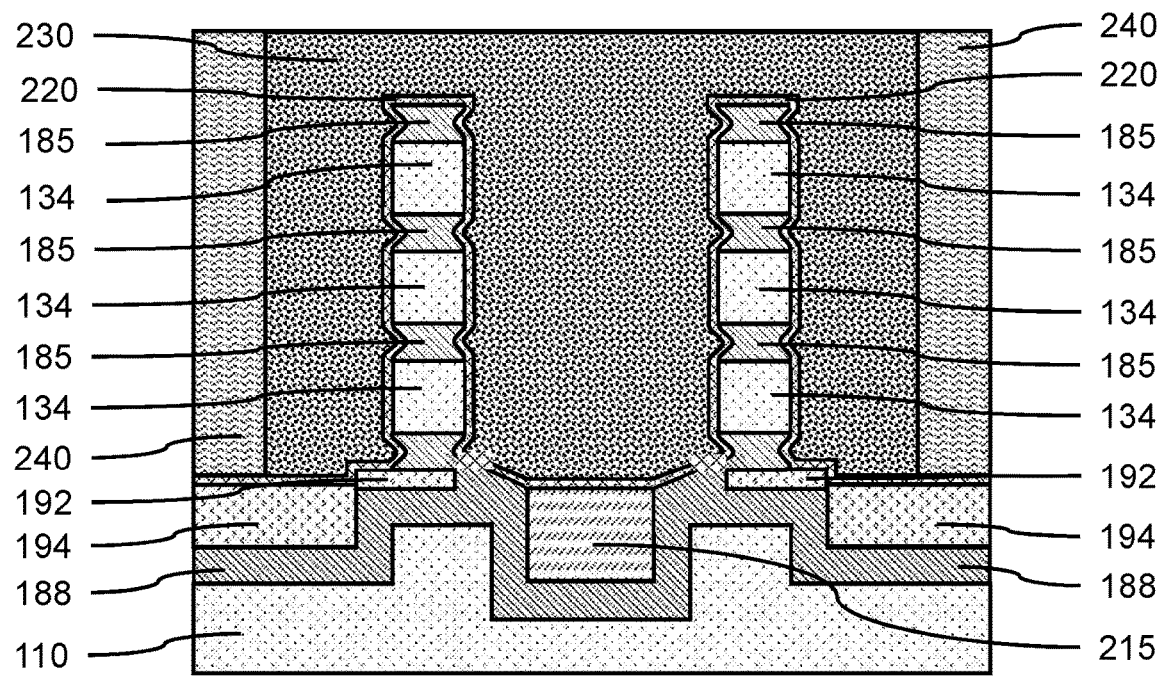
FIG. 16 is a cross-sectional side view showing a gate structure including a gate spacer and a conductive gate fill formed on the gate dielectric layer, in accordance with an embodiment of the present invention.

FIG. 16 is a cross-sectional side view showing a gate structure including a gate spacer and a conductive gate fill formed on the gate dielectric layer, in accordance with an embodiment of the present invention.

In one or more embodiments, a gate structure including a gate spacer 240 and a conductive gate fill 230 can be formed on the gate dielectric layer 220. In various embodiments, the conductive gate fill 230 can be any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and work function material (WFM). The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In one or more embodiments, the gate spacer 240 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), and combinations thereof.

Figure 17:
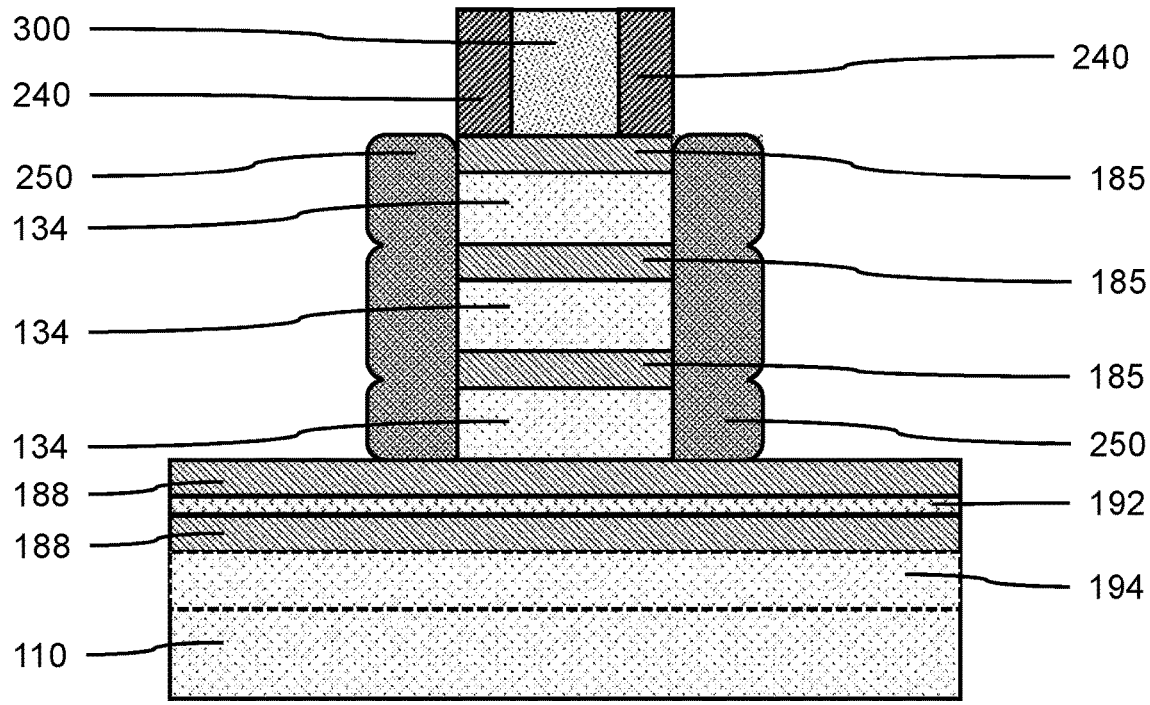
FIG. 17 is a cross-sectional side view showing source/drains formed on the nanowire segments on opposite sides of a dummy gate structure, in accordance with another embodiment of the present invention.

FIG. 17 is a cross-sectional side view showing source/drains formed on the nanowire segments on opposite sides of a dummy gate structure, in accordance with another embodiment of the present invention.

In one or more embodiments, the stacked nanowire segments 134 and nanowire supports 185 can be trimmed using a directional etch (e.g., RIE) and a dummy gate structure as a mask. The dummy gate structure can include gate spacers 240 and a dummy gate fill 300, where the dummy gate fill can be can be amorphous silicon (a-Si), amorphous carbon (a-C), germanium (Ge), silicon-germanium (SiGe), or other easily etchable materials that can be selectively removed. The dummy gate structure can further comprise other layers such as a hardmask layer to facilitate the formation of the device.

In one or more embodiments, source/drains 250 can be formed on the nanowire segments on opposite sides of a dummy gate structure, where the source/drains 250 can be formed on the exposed surfaces of the nanowire segments 134 by epitaxial or heteroepitaxial growth. The source/drains 250 can be doped to form n-type or p-type source/drains.

Figure 18:
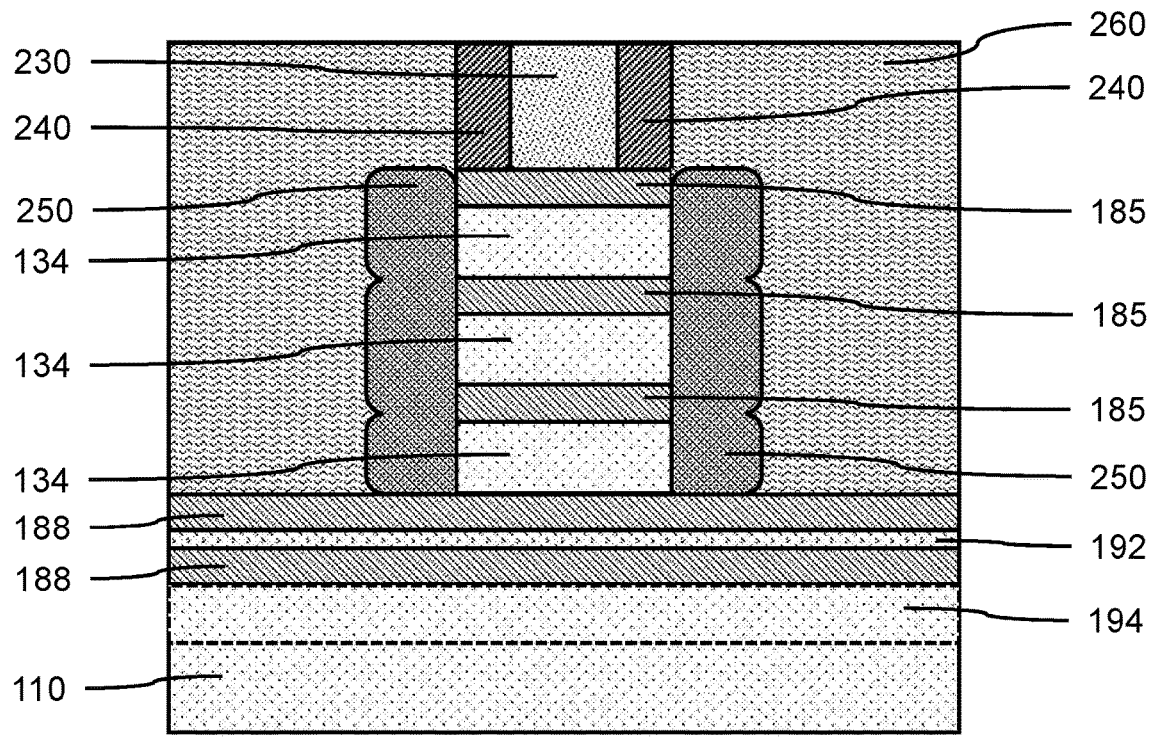
FIG. 18 is a cross-sectional side view showing an interlayer dielectric (ILD) layer formed on the source/drains and the dummy gate structure, in accordance with another embodiment of the present invention.

FIG. 18 is a cross-sectional side view showing an interlayer dielectric (ILD) layer formed on the source/drains and the dummy gate structure, in accordance with another embodiment of the present invention.

In one or more embodiments, showing an interlayer dielectric (ILD) layer 260 formed on the isolation liner 188, source/drains 250, and the dummy gate structure, where the ILD layer 260 can be formed by a blanket deposition. In various embodiments, the ILD layer 260 can be an insulating dielectric material, including, but not limited to, silicon oxide (SiO), silicon nitride (SiN), silicon oxynitride (SiON), a low-k dielectric material, amorphous carbon (a-C), or a combination thereof. A low-k dielectric material can be, for example, fluorine-doped silicon oxide (SiO:F), carbon-doped silicon oxide (SiO:C), a polymeric material, for example, tetraethyl orthosilicate (TEOS), hydrogen silsesquioxane (HSQ) and methylsilsesquioxane (MSQ), organosilicon compounds (SiCOH), and combinations thereof.

Figure 19:
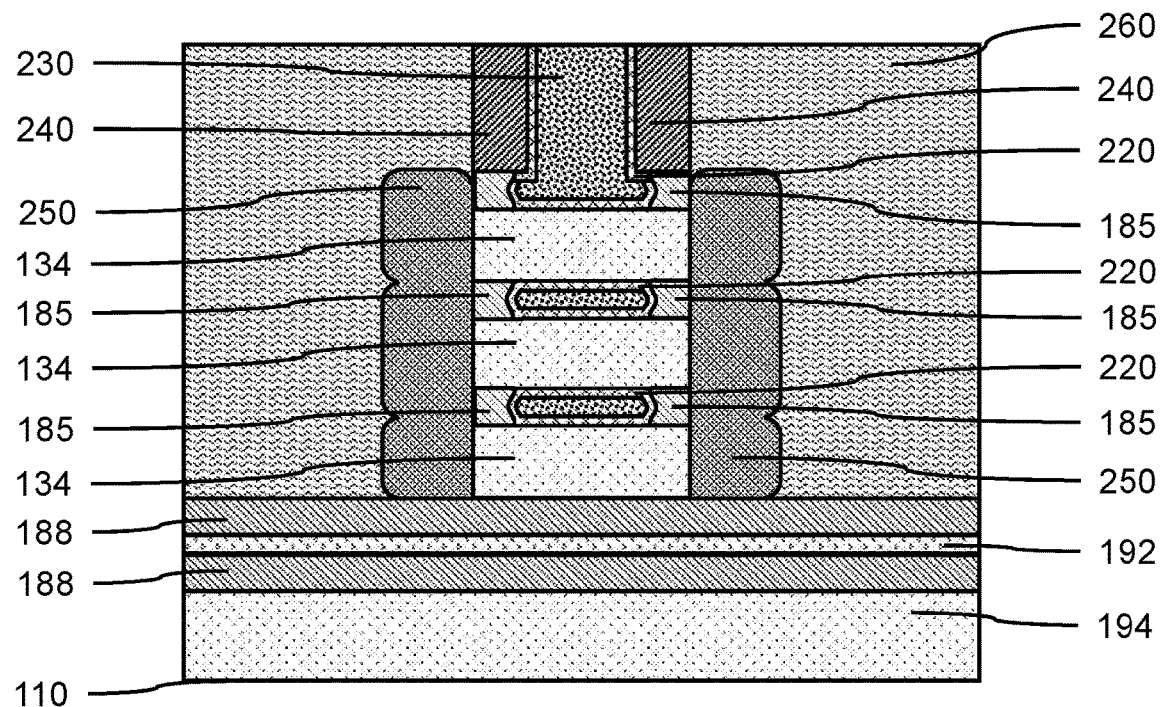
FIG. 19 is a cross-sectional side view showing the dummy gate fill removed from the dummy gate structure and replaced with a gate dielectric layer and a conductive gate fill, in accordance with another embodiment of the present invention.

FIG. 19 is a cross-sectional side view showing the dummy gate fill removed from the dummy gate structure and replaced with a gate dielectric layer and a conductive gate fill, in accordance with another embodiment of the present invention.

In one or more embodiments, the dummy gate fill can be removed using a selective isotropic etch to expose the center portions of the nanowire supports 185. The center portions of the nanowire supports 185 can be removed using a selective, isotropic etch, where indents can be formed in the remaining portions of the nanowire supports 185 by the isotropic etching.

In one or more embodiments, a gate dielectric layer 220 can be formed on the recessed fill layer 190, isolation region 215, isolation liner 188, nanowire supports 185, and nanowire segments 134, where the gate dielectric layer can be formed by a conformal deposition (e.g., ALD, PEALD).

In one or more embodiments, a conductive gate fill 230 can be formed on the gate dielectric layer 220 between the remaining portions of the nanowire supports 185.

Figure 20:
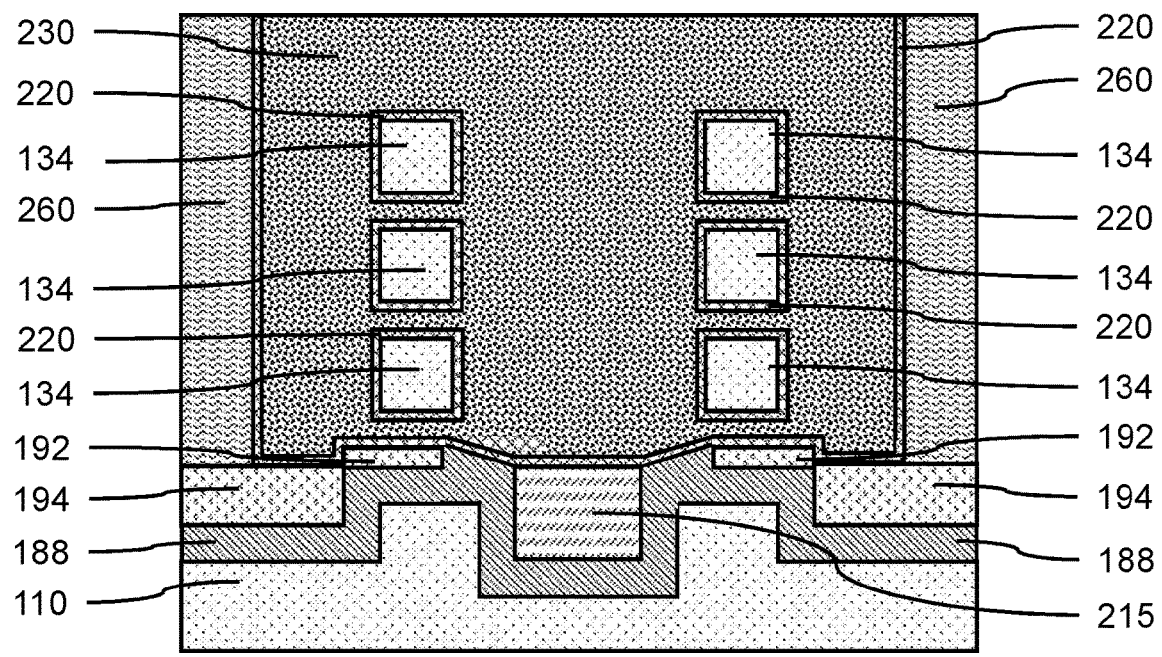
FIG. 20 is a cross-sectional side view perpendicular to FIG. 19 showing the gate dielectric layer and conductive gate fill forming a gate-all-around structure on the nanowire segments, in accordance with another embodiment of the present invention.

FIG. 20 is a cross-sectional side view perpendicular to FIG. 19 showing the gate dielectric layer and conductive gate fill forming a gate-all-around structure on the nanowire segments, in accordance with another embodiment of the present invention.

In one or more embodiments, the gate dielectric layer 220 and conductive gate fill 230 can form a gate-all-around structure around the center portions of the stacked nanowire segments 134.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a segmented channel transistor device, comprising:
    forming a stack of alternating sacrificial spacer segments and channel segments on a substrate;
    forming an outer spacer liner on the sacrificial spacer segments and channel segments;
    removing a portion of the outer spacer liner, sacrificial spacer segments, and channel segments to form stacked nanowire segments separated by remaining sacrificial portions;
    removing the remaining sacrificial portions;
    forming an inner spacer liner on the nanowire segments; and
    recessing the outer spacer liner and the inner spacer liner to form nanowire supports between the nanowire segments.

2. The method of claim 1, further comprising forming a gate dielectric layer on the nanowire supports and the nanowire segments.

3. The method of claim 2, further comprising forming a conductive gate fill on the gate dielectric layer.

4. The method of claim 1, further comprising removing a center portion of the nanowire supports to expose a center portion of the nanowire segments.

5. The method of claim 4, further comprising forming a gate dielectric layer directly on the center portion of the nanowire segments.

6. The method of claim 5, further comprising forming a conductive gate fill on the gate dielectric layer to form a gate all-around structure on a portion of the nanowire segments.

7. The method of claim 1, wherein the outer spacer liner and the inner spacer liner are made of silicon oxynitride (SiON).

8. The method of claim 1, wherein the outer spacer liner and the inner spacer liner form an isolation liner between the substrate and the nanowire segments.

9. The method of claim 1, wherein the nanowire segments are silicon (Si).

10. A method of forming a segmented channel transistor device, comprising:
    forming a stack of alternating sacrificial spacer segments and channel segments on a substrate, wherein a bottom most sacrificial spacer segment is thicker than the overlying sacrificial spacer segment(s);
    forming an outer spacer liner on the sacrificial spacer segments and channel segments, wherein the outer spacer liner forms a groove in a folded region of the outer spacer liner on the bottom most sacrificial spacer segment;
    forming a fill layer on the outer spacer liner;
    removing a central portion of the outer spacer liner, sacrificial spacer segments, and channel segments to form stacked nanowire segments separated by remaining sacrificial portions;
    removing the remaining sacrificial portions;
    forming an inner spacer liner on the nanowire segments; and
    forming a plug layer on the inner spacer liner.

11. The method of claim 10, further comprising recessing the plug layer and the fill layer to expose a portion of the inner spacer liner and outer spacer liner.

12. The method of claim 11, further comprising recessing the outer spacer liner and the inner spacer liner to form nanowire supports between the nanowire segments.

13. The method of claim 12, wherein recessing the plug layer forms a bottom isolation region on the inner spacer liner.

14. The method of claim 12, further comprising removing a portion of the nanowire supports to expose portions of the nanowire segments, and forming a gate dielectric layer on the exposed portions of the nanowire segments.

\* \* \* \* \*